(12) United States Patent
Jiang et al.

(10) Patent No.: US 8,461,685 B2
(45) Date of Patent: Jun. 11, 2013

(54) SUBSTRATE COMPRISING A PLURALITY OF INTEGRATED CIRCUITRY DIE, AND A SUBSTRATE

(75) Inventors: Tongbi Jiang, Boise, ID (US); Mike Connell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1222 days.

(21) Appl. No.: 11/243,925

(22) Filed: Oct. 4, 2005

(65) Prior Publication Data

US 2006/0030077 A1 Feb. 9, 2006

Related U.S. Application Data

(63) Continuation of application No. 10/302,328, filed on Nov. 22, 2002, now abandoned.

(51) Int. Cl.
*H01L 23/48* (2006.01)
*H01L 23/52* (2006.01)
*H01L 29/40* (2006.01)

(52) U.S. Cl.
USPC ...... 257/760; 257/750; 257/753; 257/E23.12; 438/612

(58) Field of Classification Search
USPC ............ 257/750, 753, 760, E23.12; 438/612
See application file for complete search history.

(56) References Cited

U.S. PATENT DOCUMENTS

| | | |
|---|---|---|
| 4,328,262 A | 5/1982 | Kurahashi et al. |
| 4,505,029 A | 3/1985 | Owyang et al. |
| 4,982,265 A | 1/1991 | Watanabe et al. |
| 4,988,403 A | 1/1991 | Matuo |
| 5,013,689 A | 5/1991 | Yamamoto et al. |
| 5,097,317 A | 3/1992 | Fujimoto et al. |
| 5,136,364 A | 8/1992 | Byrne |
| 5,171,716 A | 12/1992 | Cagan et al. |
| 5,180,691 A | 1/1993 | Adachi et al. |
| 5,287,003 A | 2/1994 | Van Andel et al. |
| 5,406,117 A | 4/1995 | Dlugokecki et al. |
| 5,430,329 A * | 7/1995 | Harada et al. ................ 257/786 |
| 5,563,102 A | 10/1996 | Michael |
| 5,600,151 A | 2/1997 | Adachi et al. |
| 5,693,565 A | 12/1997 | Camilletti et al. |

(Continued)

OTHER PUBLICATIONS

Garrou et al., *Stress-Buffer and Passivation Processes for Si and GaAs IC's and Passive Components . . .* , IEEE Transactions on Advanced Packaging, vol. 22, No. 3, pp. 487-498 (Aug. 1999).

(Continued)

*Primary Examiner* — Meiya Li
(74) *Attorney, Agent, or Firm* — Wells St. John P.S.

(57) ABSTRACT

A substrate including a plurality of integrated circuitry die is fabricated or otherwise provided. The individual die have bond pads. A passivation layer comprising a silicone material is formed over the bond pads. Openings are formed through the silicone material to the bond pads. After the openings are formed, the die are singulated from the substrate. In one implementation, a method of fabricating integrated circuitry includes providing a substrate comprising a plurality of integrated circuitry die. Individual of the die have bond pads. A first blanket passivation layer is formed over the substrate in contact with the bond pads. A different second blanket passivation layer comprising silicone material is formed over the first passivation layer. Openings are formed through the first and second passivation layers to the bond pads. After the openings are formed, the die are singulated from the substrate. Other aspects and implementations are contemplated.

16 Claims, 8 Drawing Sheets

U.S. PATENT DOCUMENTS

| | | | |
|---|---|---|---|
| 5,719,606 A * | 2/1998 | Kigawa et al. | 347/69 |
| 5,825,078 A | 10/1998 | Michael | |
| 5,834,844 A | 11/1998 | Akagawa et al. | |
| 5,888,846 A | 3/1999 | Miyata et al. | |
| 5,989,510 A * | 11/1999 | Abe et al. | 423/339 |
| 6,075,290 A | 6/2000 | Schaefer et al. | |
| 6,127,099 A | 10/2000 | Shinohara | |
| 6,143,668 A | 11/2000 | Dass et al. | |
| 6,274,224 B1 * | 8/2001 | O'Bryan et al. | 428/209 |
| 6,313,044 B1 | 11/2001 | Lee | |
| 6,368,896 B2 | 4/2002 | Farnworth et al. | |
| 6,383,893 B1 | 5/2002 | Begle et al. | |
| 6,388,337 B1 | 5/2002 | Michael et al. | |
| 6,410,414 B1 | 6/2002 | Lee | |
| 6,492,200 B1 | 12/2002 | Park et al. | |
| 6,501,014 B1 | 12/2002 | Kubota et al. | |
| 6,539,624 B1 | 4/2003 | Kung et al. | |
| 6,576,990 B2 | 6/2003 | Flesher et al. | |
| 6,586,276 B2 | 7/2003 | Towle et al. | |
| 6,586,323 B1 | 7/2003 | Fan et al. | |
| 6,617,674 B2 | 9/2003 | Becker et al. | |
| 6,646,354 B2 | 11/2003 | Cobbley et al. | |
| 6,696,317 B1 * | 2/2004 | Honda | 438/108 |
| 6,709,893 B2 | 3/2004 | Moden et al. | |
| 6,709,896 B1 | 3/2004 | Cobbley et al. | |
| 6,743,664 B2 | 6/2004 | Liang et al. | |
| 6,783,692 B2 | 8/2004 | Bhagwagar | |
| 6,803,303 B1 * | 10/2004 | Hiatt et al. | 438/612 |
| 6,858,927 B2 | 2/2005 | Prindiville et al. | |
| 6,887,771 B2 | 5/2005 | Kobayashi | |
| 6,896,760 B1 | 5/2005 | Connell et al. | |
| 6,900,079 B2 | 5/2005 | Kinsman et al. | |
| 6,940,177 B2 | 9/2005 | Dent et al. | |
| 2002/0048848 A1 * | 4/2002 | Ikegami | 438/108 |
| 2002/0053746 A1 * | 5/2002 | Stamper et al. | 257/781 |
| 2003/0013232 A1 * | 1/2003 | Towle et al. | 438/113 |
| 2003/0025188 A1 | 2/2003 | Farnworth et al. | |
| 2003/0027918 A1 | 2/2003 | Tsutsumi et al. | |
| 2003/0030132 A1 | 2/2003 | Lee et al. | |
| 2003/0082925 A1 | 5/2003 | Yano et al. | |
| 2003/0143794 A1 | 7/2003 | Nakamura et al. | |
| 2003/0153103 A1 | 8/2003 | Perry | |
| 2003/0230799 A1 | 12/2003 | Yee et al. | |

OTHER PUBLICATIONS

Miura, *Spherical Filler-Induced Damage in IC Plastic Packages*, Advances in Electronic Packaging, vol. 26-1, pp. 167-172 (1999).

Yalamanchili et al., *Filler Induced Metal Crush Failure Mechanism in Plastic Encapsulated Devices*, IEEE 37$^{th}$ Annual International Reliability Physics Symposium, San Diego, California, pp. 341-346 (1999).

* cited by examiner

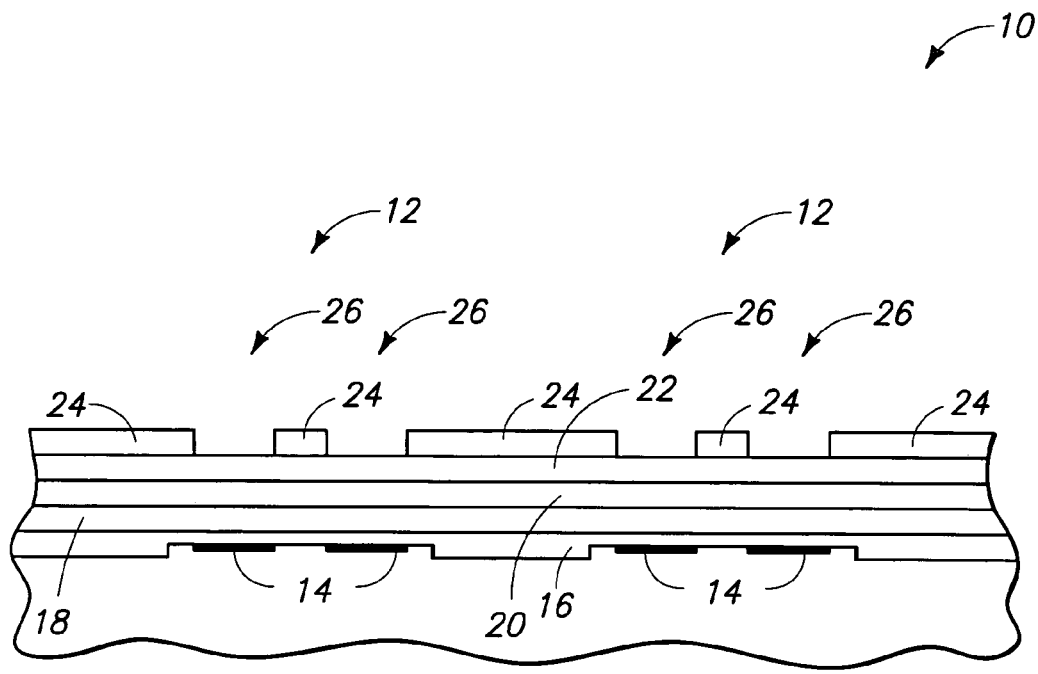
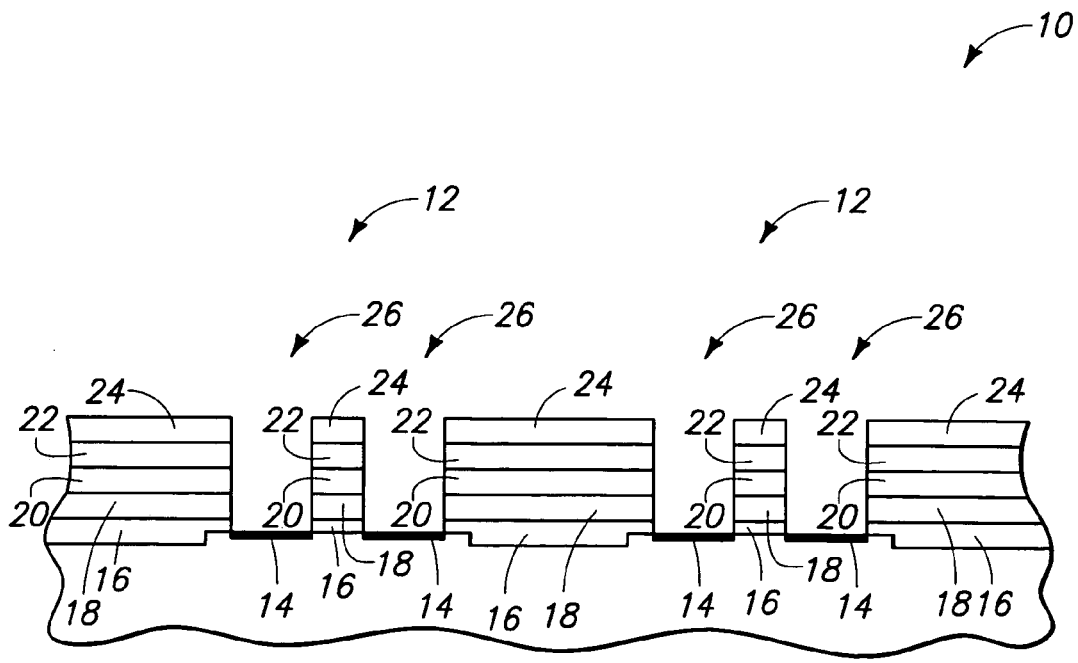

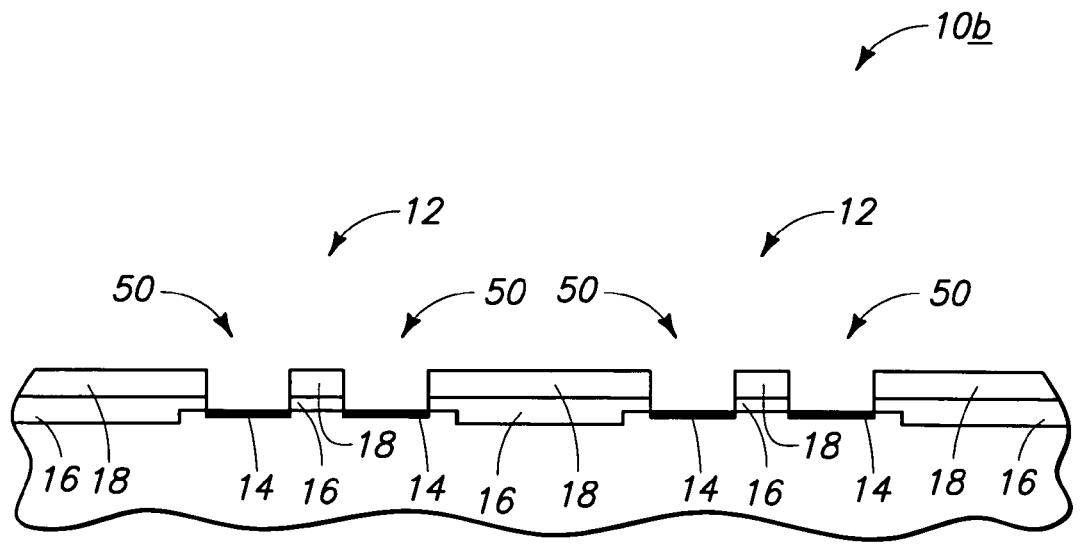
_FIG_ 11
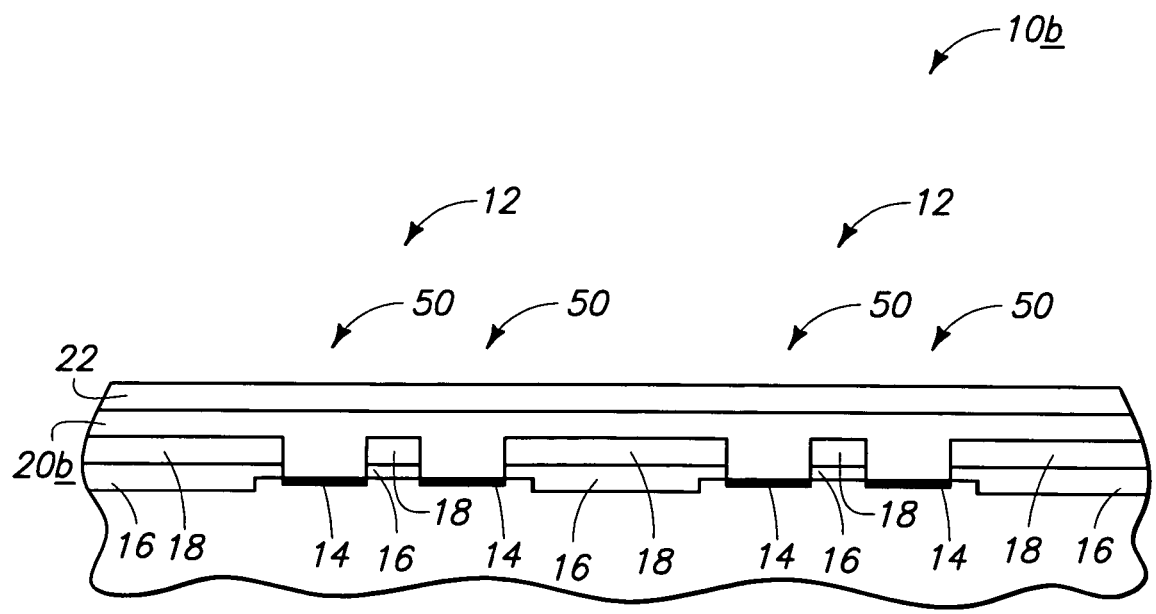
_FIG_ 12

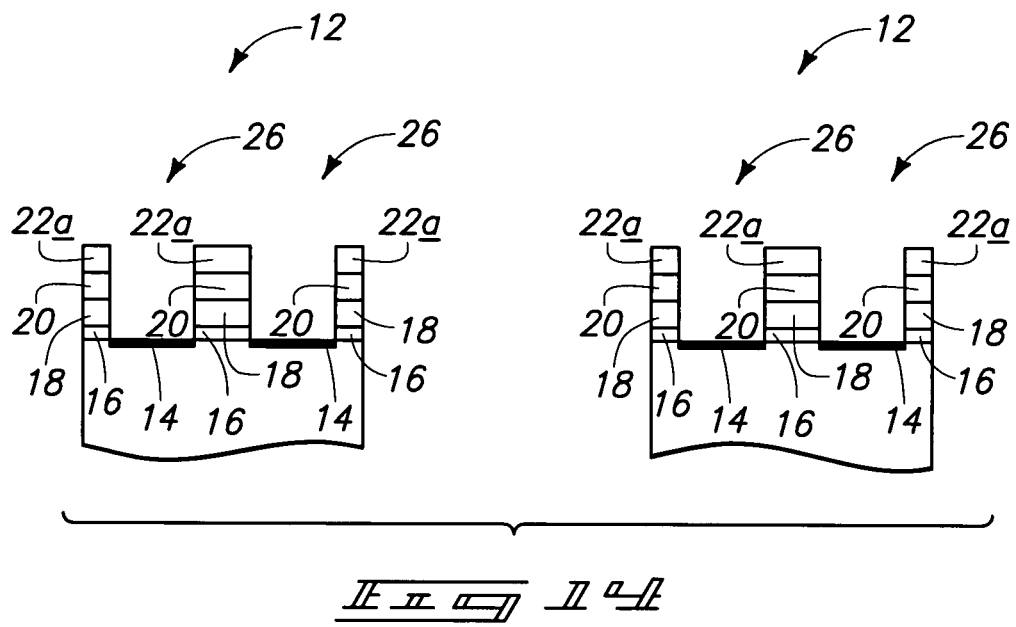
_F I G 14_
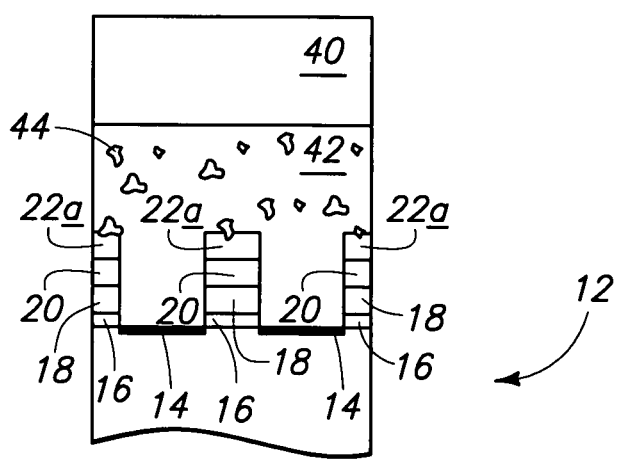
_F I G 15_

SUBSTRATE COMPRISING A PLURALITY OF INTEGRATED CIRCUITRY DIE, AND A SUBSTRATE

RELATED PATENT DATA

This patent resulted from a continuation application of U.S. patent application Ser. No. 10/302,328, filed Nov. 22, 2002, now abandoned entitled "Methods of Fabricating Integrated Circuitry", naming Tongbi Jiang and Mike Connell as inventors, the disclosure of which is incorporated by reference.

TECHNICAL FIELD

This invention relates to methods of fabricating integrated circuitry.

BACKGROUND OF THE INVENTION

Integrated circuitry fabrication typically fabricates multiple discrete integrated circuits or chips over a single substrate. A typical substrate utilized today is a monocrystalline silicon wafer within and upon which integrated circuitry is fabricated. Regardless, at the completion of fabrication, the substrate is cut or otherwise processed to singulate the die into individual integrated circuitry chips/die. Typically, the individual chips/die are mounted and electrically connected with larger circuit boards, lead frames or other substrates which connect or otherwise become a part of some form of larger operable hardware.

In many applications, the individual die as connected/mounted to another substrate are encapsulated in epoxy resin mold materials for fixating and protecting the mounted chip. Typically, the epoxy mold compounds have a much higher thermal coefficient of expansion than that of the typical silicon die and even other substrate materials to which the die are mounted. These differences in thermal coefficients of expansion can result in considerable internal stresses in the ultimately encapsulated device, in some cases leading to circuitry failure.

One manner of overcoming the stress caused by differences in thermal coefficients of expansion includes silicon dioxide filler materials within the mold compound. Typically, the intent and effect is to modify the thermal coefficient of expansion of the pure molding material to better approximate that of the die and other substrate materials. Unfortunately, the hard silicon dioxide particles can create their own problems. Specifically, upon application and cure of the molding material, the silicon dioxide particles can penetrate into the outer passivation layers fabricated on the chip. This can result in the cracking of those layers as well as the material of the integrated circuitry underlying the passivation layers and lead to failure.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of fabricating integrated circuitry. In one implementation, a substrate comprising a plurality of integrated circuitry die is provided. The individual die have bond pads. A passivation layer comprising a silicone material is formed over the bond pads. Openings are formed through the silicone material to the bond pads. After the openings are formed, the die are singulated from the substrate.

In one implementation, a method of fabricating integrated circuitry includes providing a substrate comprising a plurality of integrated circuitry die. Individual of the die have bond pads. A first blanket passivation layer is formed over the substrate in contact with the bond pads. A different second blanket passivation layer comprising silicone material is formed over the first passivation layer. Openings are formed through the first and second passivation layers to the bond pads. After the openings are formed, the die are singulated from the substrate.

Other aspects and implementations are contemplated.

BRIEF DESCRIPTION OF THE DRAWINGS

Preferred embodiments of the invention are described below with reference to the following accompanying drawings.

FIG. 7 is a view of the FIG. 6 substrate at a processing step subsequent to that shown by FIG. 6.

FIG. 8 is a view of the FIG. 7 substrate at a processing step subsequent to that shown by FIG. 7.

FIG. 11 is an alternate embodiment of the FIG. 4 substrate at a processing step subsequent to that depicted by FIG. 4.

FIG. 12 is a view of the FIG. 11 substrate at a processing step subsequent to that shown by FIG. 11.

FIG. 14 is a view of the FIG. 8 substrate at a processing step subsequent to that shown by FIG. 8.

FIG. 15 is a view of the FIG. 14 substrate at a processing step subsequent to that shown by FIG. 14.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
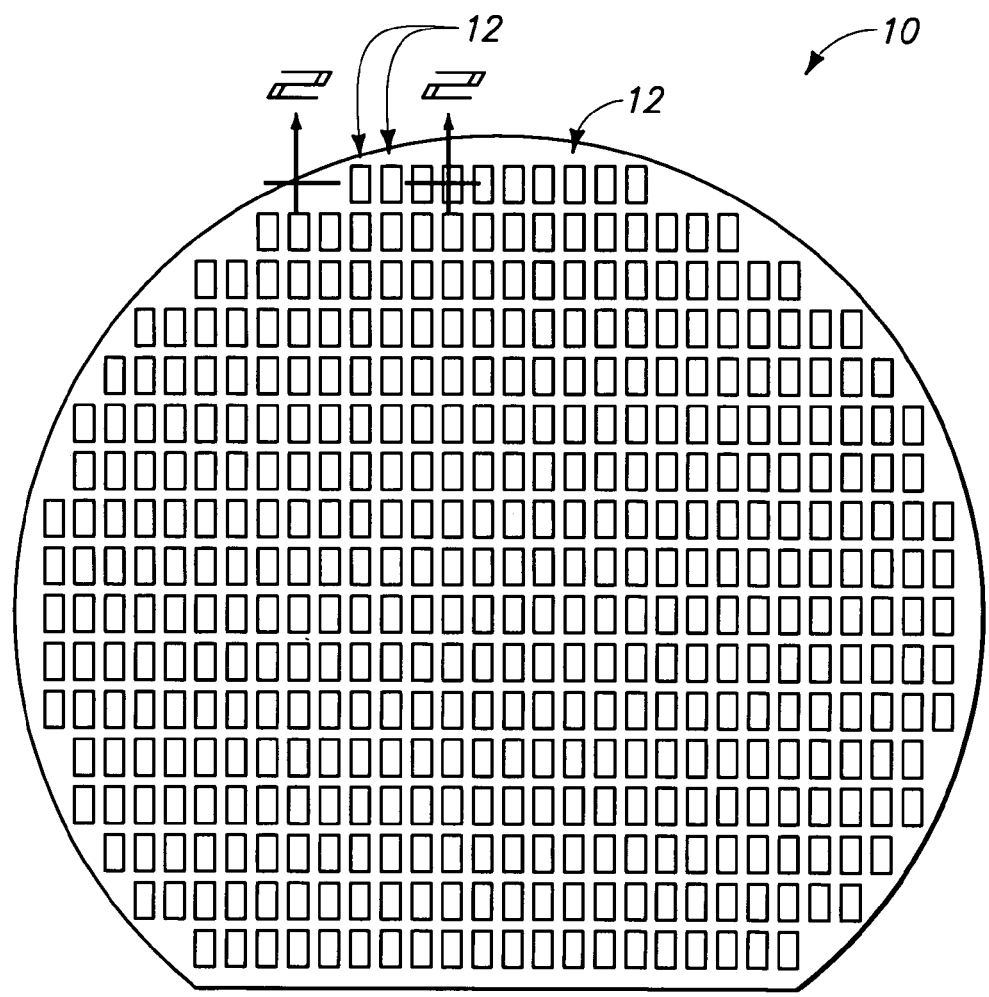
FIG. 1 is a diagrammatic top view of an exemplary substrate at a processing step in accordance with an aspect of the invention.
Figure 2:
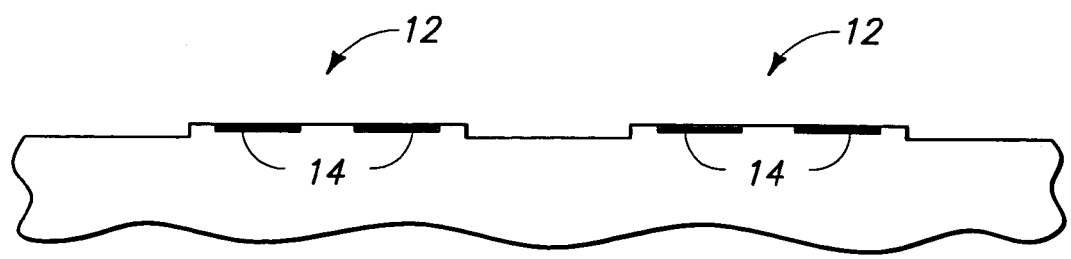
FIG. 2 is a diagrammatic sectional view taken through line 2-2 in FIG. 1.

In accordance with aspects of the invention, and by way of example only, preferred methodical embodiments are described with reference to FIGS. 1-12. The illustrated relationships between the various layers and die are exaggerated in the figures for clarity, and are only diagrammatic depictions thereof. Referring initially to FIGS. 1 and 2, a substrate in the form of a semiconductor wafer is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 has been processed to include a plurality of integrated circuitry die 12. Such have been fabricated to include a plurality of bond pads 14 which will be utilized ultimately in electrically connecting the integrated circuitry of the die with external components.

Figure 3:
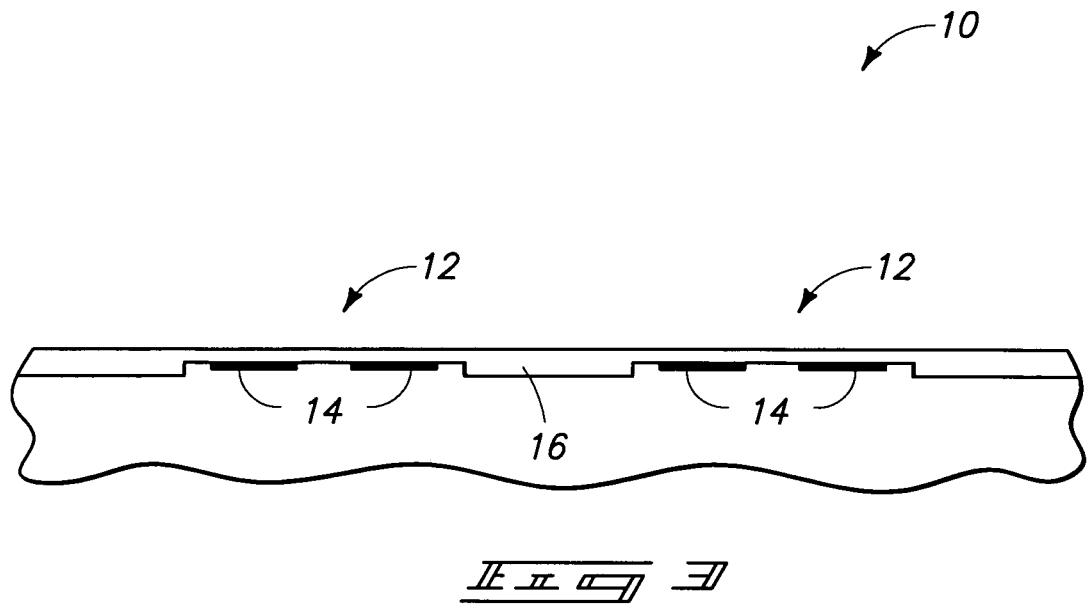
FIG. 3 is a view of the FIG. 2 substrate at a processing step subsequent to that shown by FIG. 2.

Referring to FIG. 3, an exemplary first passivation layer 16 is formed over substrate 10 and in contact with bond pads 14. An exemplary preferred material is undoped silicon dioxide, for example deposited by decomposition of tetraethylorthosilicate (TEOS). In one preferred embodiment, first passivation layer 16 consists essentially of silicon dioxide. By way of example only, a thickness range for layer 16 is from 5,000 Angstroms to 10,000 Angstroms.

Figure 4:
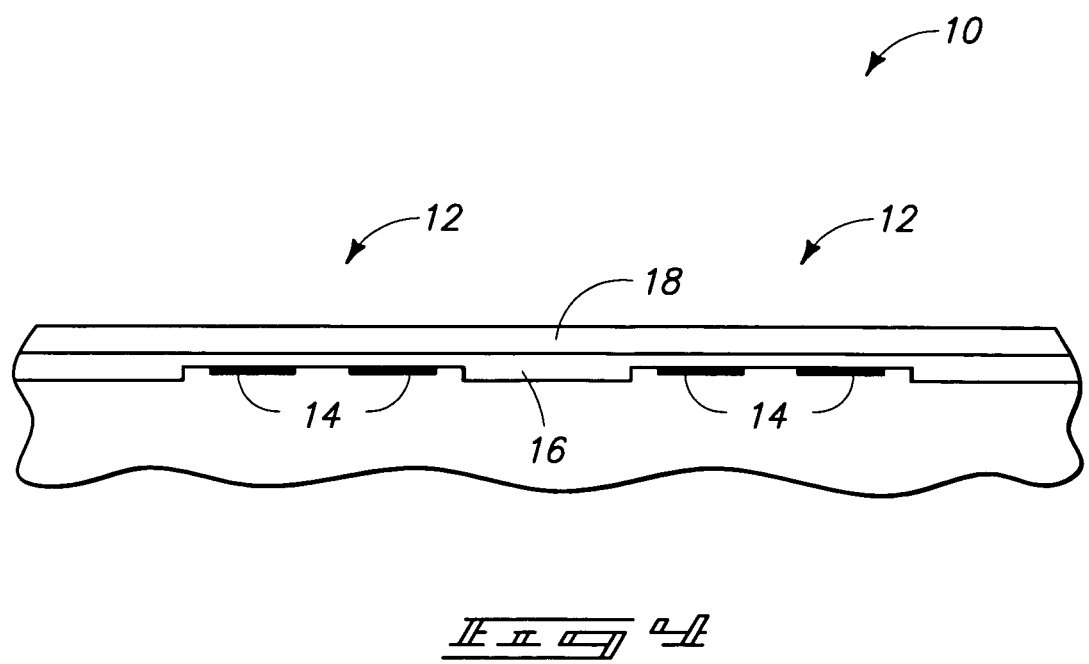
FIG. 4 is a view of the FIG. 3 substrate at a processing step subsequent to that shown by FIG. 3.

Referring to FIG. 4, another passivation layer 18 is formed over and on (meaning in contact with) first passivation layer 16. An exemplary material for layer 18 is silicon nitride, with layer 18 consisting essentially of silicon nitride in one preferred embodiment. An exemplary preferred thickness range for layer 18 is from 0.2 micron to 5 microns.

Figure 5:
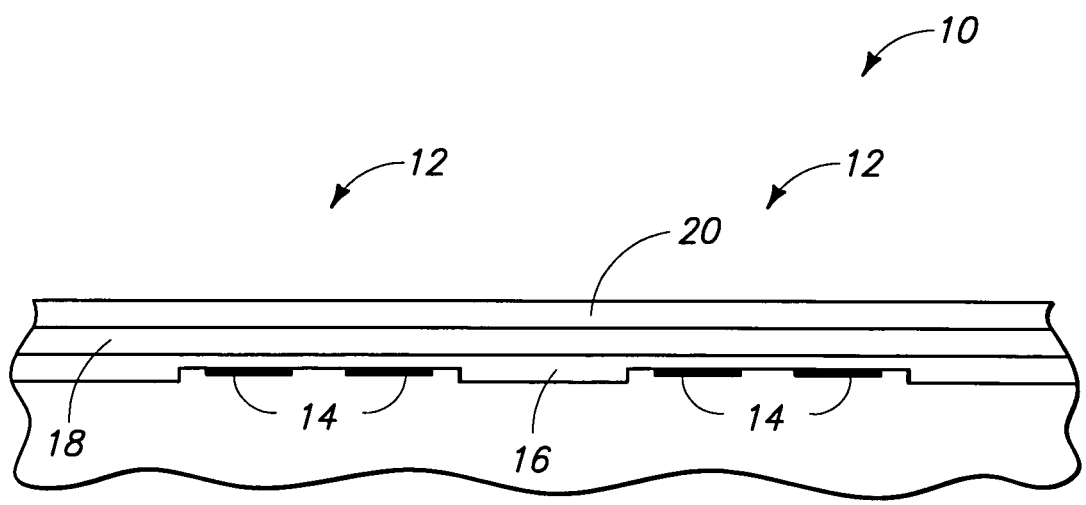
FIG. 5 is a view of the FIG. 4 substrate at a processing step subsequent to that shown by FIG. 4.

Referring to FIG. 5, another passivation layer 20 is formed over and on passivation layer 18. A preferred material is polyimide, with an exemplary preferred thickness range being from 1 micron to 10 microns.

Figure 6:
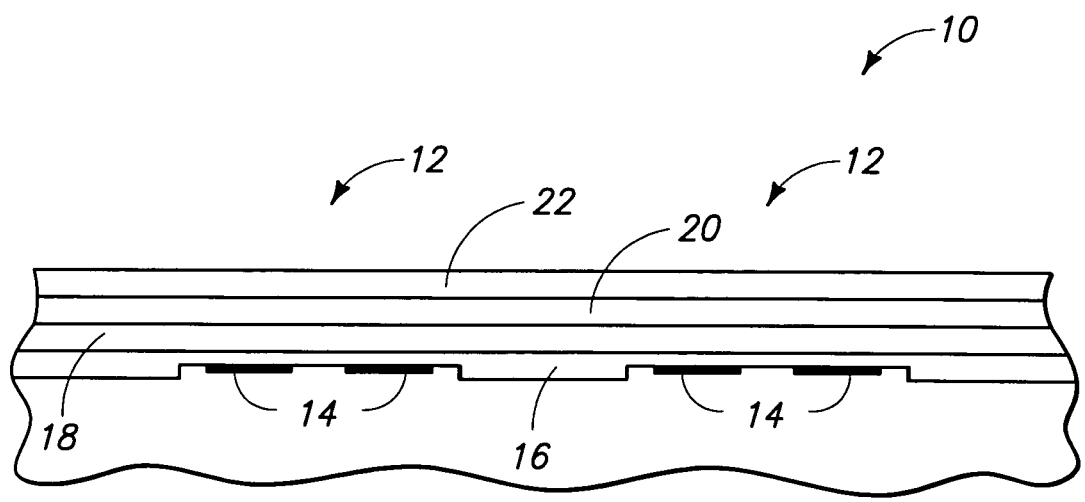
FIG. 6 is a view of the FIG. 5 substrate at a processing step subsequent to that shown by FIG. 5.

Referring to FIG. 6, a passivation layer 22 comprising one or more silicone materials is formed over and on passivation layer 20. Layer 22 is most preferably formed to have a Young's modulus of no greater than 9.0 GPa. Exemplary preferred silicone materials include those available from Dow Corning of Auburn, Mich. for example the Dow Corning MXX-P family of silicones, with M300-P from such family being one specific example. An exemplary such layer can act as a stress buffer and preclude silica or other particles within molding compounds or other materials from cracking layers and other material therebeneath.

Referring to FIG. 7, a photoresist layer 24 has been formed over passivation layer 22 comprising silicone material. A series of openings 26 have been formed therein over bond pads 14.

Referring to FIG. 8, openings 26 have been extended through passivation layers 22, 20, 18 and 16 to expose bond pads 14. Photoresist layer 24 would then be completely removed from the substrate. An exemplary dry chemistry for etching through the silicone material and polyimide material would be $O_2$ plasma. Such would also typically etch photoresist, which would warrant making the photoresist layer sufficiently thick to complete etching through the silicone material and the polyimide before the photoresist was etched completely away. Silicon dioxide and silicon nitride can be etched using $CF_4$ and $CHF_3$ chemistries.

Figure 9:
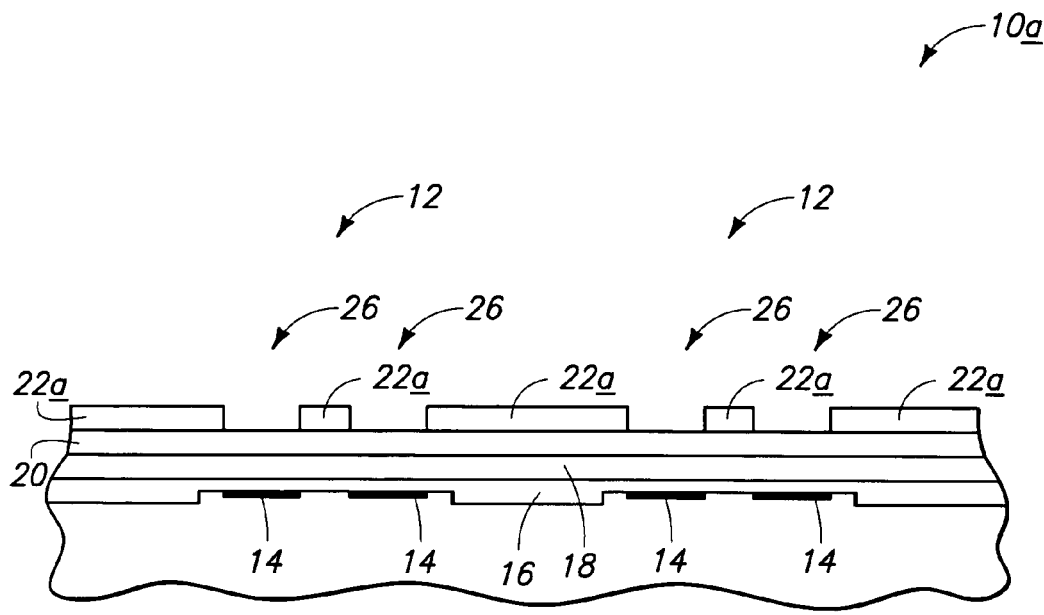
FIG. 9 is an alternate embodiment of the FIG. 5 substrate at a processing step subsequent to that depicted by FIG. 5.

Such provides but one example of forming openings through the passivation layer 22 comprising silicone material to the bond pads, with such method utilizing photolithography and etch employing a photoresist that is completely removed from the substrate prior to the singulating of the die from the substrate. FIG. 9 illustrates an alternate embodiment processing with respect to a substrate 10a. Like numerals from the first described embodiment are utilized where appropriate, with differences being indicated with the suffix "a" or with different numerals. In FIG. 9, a passivation layer 22a comprising a silicone material is formed to be inherently photoimageable. An example preferred photoimageable silicone material for passivation layer 22a is the same M300-P material referred to above. Such can enable the fabrication of the substrate using photolithography without using a separate photoresist material which is ultimately removed from the substrate. FIG. 9 depicts exemplary alternate processing to that depicted by FIG. 8, whereby passivation layer 22a has been photopatterned, for example utilizing a mask, with suitable actinic energy effective to change the solubility in a solvent of selected regions of the passivation layer which are received over bond pads 14. FIG. 9 depicts such substrate as having been exposed to a suitable developing solvent effective to remove the selected regions from over the bond pads, thereby forming exemplary openings 26 therein/in place thereof. Accordingly, if desired, such processing can be essentially identical to that of FIG. 7, but void of any photoresist layer over passivation layer 22a.

Figure 10:
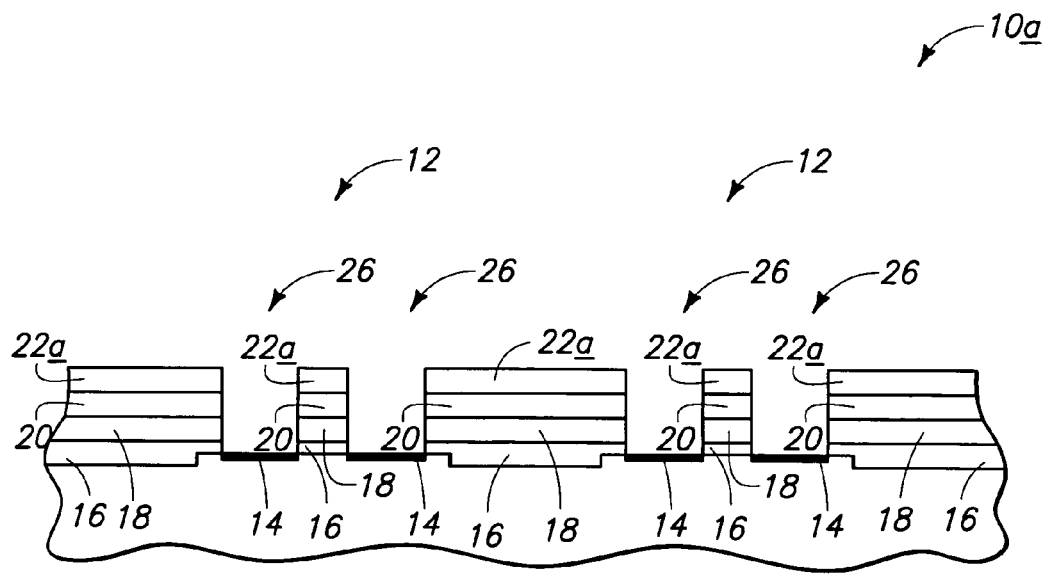
FIG. 10 is a view of the FIG. 9 substrate at a processing step subsequent to that shown by FIG. 9.

Referring to FIG. 10, the removed selected regions of passivation layer 22a have been etched through, utilizing layer 22a as a mask, layers 20, 18 and 16 to expose bond pads 14. Again and preferably, such can be conducted without any use of photoresist over layer 22a.

The above depicts but two examples of forming openings through silicone material containing passivation layer 22 to bond pads 14, with each utilizing photolithography and etch. However, other methods utilizing photolithography and etch, as well as methods not utilizing photolithography and etch, are also contemplated, and whether existing or yet-to-be developed. Further, the above exemplary processing forms the passivation layer comprising silicone material over one or more other passivation layers, for example those comprising polyimide and silicon nitride. One or both of the polyimide or silicon nitride layers might be eliminated, or one or more other layers substituted therefor. The same applies with respect to the preferred embodiment undoped silicon dioxide passivation layer 16. Further, the orders of any of the above layers could be switched or otherwise modified, with the embodiment in the initially described order being but one preferred example. Further but less preferred, the passivation layer comprising the silicone material might be fabricated to be other than the outermost layer. Also in the depicted and preferred embodiments, the passivation layer comprising silicone material is formed such that it is not in contact with bond pads 14, although such could be fabricated to be in contact with bond pads 14.

FIG. 11 illustrates an alternate embodiment processing with respect to a substrate 10b. Like numerals from the first described embodiments are utilized where appropriate, with differences being indicated with the suffix "b" or with different numerals. FIG. 11 illustrates processing subsequent to that of FIG. 4 whereby openings 50 have been formed through layers 18 and 16 to bond pads 14. Such could be by photolithographic and etch manners, or by any other means whether existing of yet-to-be-developed.

Referring to FIG. 12, a polyimide comprising passivation layer 20b is formed over passivation layers 16 and 18 to within openings 50. Silicone material comprising passivation layer 22 is formed thereover.

Figure 13:
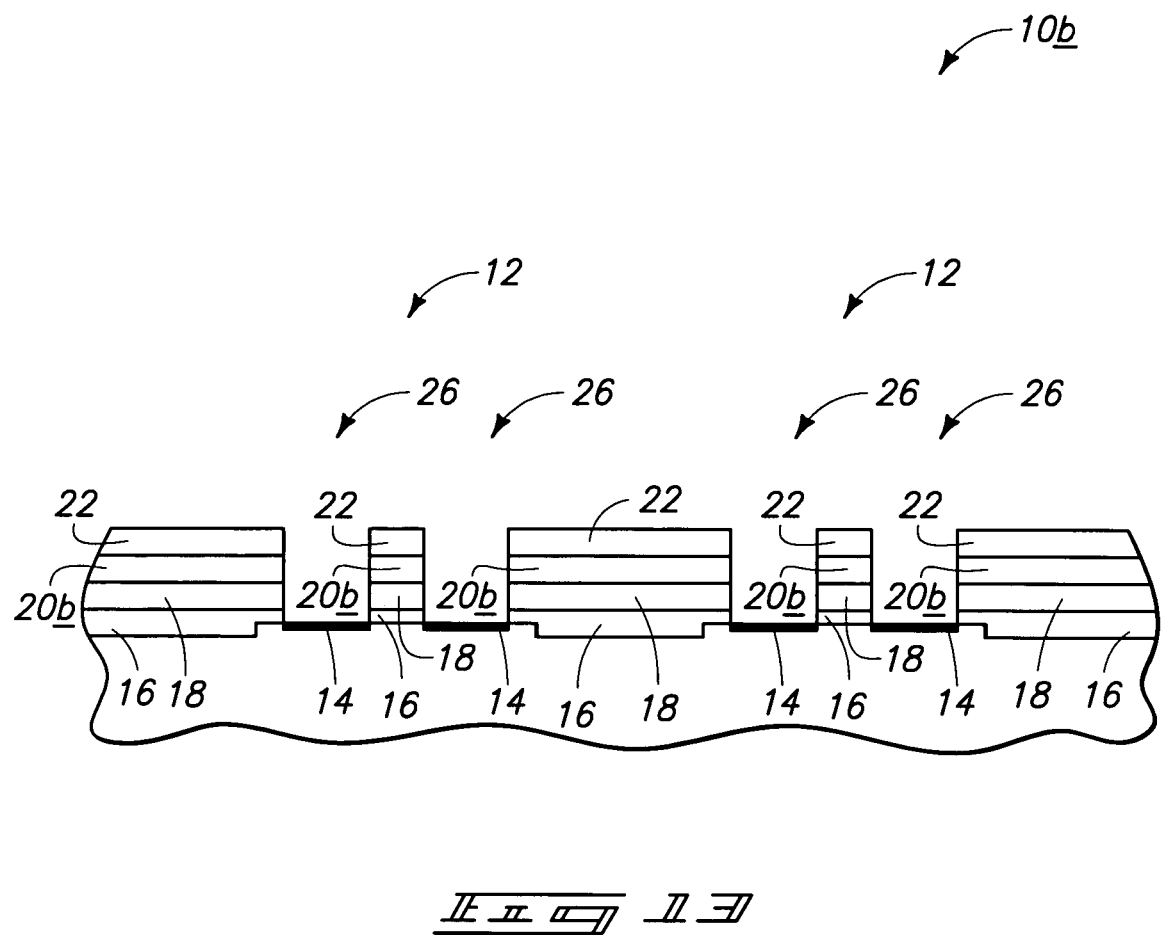
FIG. 13 is a view of the FIG. 12 substrate at a processing step subsequent to that shown by FIG. 12.

Referring to FIG. 13, openings 26 are formed to bond pads 14. Again, such could be by photolithographic and etch manners, or by any other means whether existing of yet-to-be-developed.

Referring to FIG. 14, die 12 have been singulated from substrate 10/10a/10b. Such as-singulated die comprise at least some outermost layer, i.e., layer 22/22a, which predominately comprises the passivation layer having the silicone material. Alternately, the substrate might be fabricated such that the illustrated uppermost/outermost layer does not predominately comprise the passivation layer containing silicone material. Regardless if desired, such can be mounted or otherwise provided with respect to other substrates, and wire or other bond connections made through the illustrated openings to the bond pads.

Referring to FIG. 15, an exemplary additional substrate 40 is shown bonded to die 12 using a resin 42 containing solid particles 44. As shown in FIG. 15, some of solid particles 44 in resin 42 extend into layer 22a which includes silicone-comprising material for example as described above. Such provides but one example of contacting the passivation layer comprising silicone material with a silica particle containing resin, in but one exemplary preferred embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A substrate comprising a plurality of integrated circuitry dies, individual of the integrated circuitry dies having bond pads, the substrate comprising:
   first passivation material comprising at least one of silicon dioxide and silicon nitride received over the integrated circuitry dies;
   second passivation material comprising polyimide received over the first passivation material;
   silicone-comprising passivation material received over the second passivation material;
   openings extending through the silicone-comprising passivation material, through the second passivation material and through the first passivation material to the bond pads; and
   a silica particle-containing resin distinct from and received over the silicone-comprising passivation material and within the openings, solid particles of the silica particle-containing resin extending from the silica particle-containing resin into the silicone-comprising passivation material.

2. The substrate of claim 1 wherein the first passivation material comprises silicon dioxide.

3. The substrate of claim 1 wherein the first passivation material comprises silicon nitride.

4. The substrate of claim 1 wherein the first passivation material comprises silicon dioxide and silicon nitride.

5. The substrate of claim 4 wherein the first passivation material comprises silicon dioxide received on silicon nitride.

6. The substrate of claim 4 wherein the first passivation material comprises silicon nitride received on silicon dioxide.

7. The substrate of claim 1 wherein the silicone-comprising passivation material has a Young's modulus of no greater than 9.0 GPa.

8. The substrate of claim 1 wherein the solid particles are silica particles.

9. The substrate of claim 1 wherein the solid particles are not all of uniform size or shape.

10. A substrate comprising:
    integrated circuitry die comprising semiconductive material;
    the integrated circuitry die comprising bond pads;
    first passivation material comprising at least one of silicon dioxide and silicon nitride received over the integrated circuitry die;
    second passivation material comprising polyimide received over the first passivation material;
    silicone-comprising passivation material received over the second passivation material; and
    a silica particle-containing resin distinct from and received over the silicone-comprising passivation material and the second passivation material, solid particles of the silica particle-containing resin extending from the silica particle-containing resin into the silicone-comprising passivation material.

11. The substrate of claim 10 wherein the silicone-comprising passivation material is formed on the second passivation material.

12. The substrate of claim 10 wherein the first passivation material comprises silicon dioxide and silicon nitride.

13. The substrate of claim 10 wherein the silica particles are not all of uniform size or shape.

14. A pair of substrates comprising:
    a first substrate of the pair of substrates comprising an integrated circuitry die comprising semiconductive material;
    the integrated circuitry die comprising bond pads;
    at least one of silicon dioxide and silicon nitride received over the integrated circuitry die;
    polyimide received over the at least one of silicon dioxide and silicon nitride;
    a silicone material received over the polyimide;
    a silica particle-containing resin distinct from and received over the silicone material, solid particles of the silica particle-containing resin extending from the silica particle-containing resin into the silicone material;
    a second substrate of the pair of substrates bonded to the first substrate by the solid particle-containing resin.

15. The pair of substrates of claim 14 wherein the solid particles are silica particles.

16. The pair of substrates substrate of claim 14 wherein the solid particles are not all of uniform size or shape.

* * * * *

UNITED STATES PATENT AND TRADEMARK OFFICE
CERTIFICATE OF CORRECTION

PATENT NO. : 8,461,685 B2
APPLICATION NO. : 11/243925
DATED : June 11, 2013
INVENTOR(S) : Tongbi Jiang et al.

It is certified that error appears in the above-identified patent and that said Letters Patent is hereby corrected as shown below:

In the Claims:

In column 6, line 53, in Claim 16, after "substrates" delete "substrate".

Signed and Sealed this
Tenth Day of September, 2013

Teresa Stanek Rea
*Acting Director of the United States Patent and Trademark Office*